(12) United States Patent
Fukui et al.

(10) Patent No.: US 8,449,676 B2
(45) Date of Patent: May 28, 2013

(54) SILICA GLASS CRUCIBLE

(75) Inventors: Masanori Fukui, Akita (JP); Hiroshi Kishi, Akita (JP)

(73) Assignee: Japan Super Quartz Corporation, Akita (JP)

( * ) Notice: Subject to any disclaimer, the term of this patent is extended or adjusted under 35 U.S.C. 154(b) by 1066 days.

(21) Appl. No.: 12/430,311

(22) Filed: Apr. 27, 2009

(65) Prior Publication Data

US 2009/0272315 A1    Nov. 5, 2009

(30) Foreign Application Priority Data

Apr. 30, 2008   (JP) ................................ 2008-118195

(51) Int. Cl.
- C30B 35/00   (2006.01)
- C30B 11/00   (2006.01)
- C30B 15/00   (2006.01)
- C30B 21/06   (2006.01)
- C30B 27/02   (2006.01)
- C30B 28/10   (2006.01)
- C30B 30/04   (2006.01)

(52) U.S. Cl.
USPC ............ 117/208; 117/200; 117/206; 117/213

(58) Field of Classification Search
USPC .................. 117/208, 200, 206, 213
See application file for complete search history.

(56) References Cited

U.S. PATENT DOCUMENTS

| | | | |
|---|---|---|---|
| 5,913,975 A * | 6/1999 | Holder ........................ | 117/206 |
| 5,976,247 A * | 11/1999 | Hansen et al. ............... | 117/200 |
| 2005/0235907 A1* | 10/2005 | Ohama et al. ............... | 117/200 |

FOREIGN PATENT DOCUMENTS

| | | |
|---|---|---|
| JP | 9-110590 | 4/1997 |
| JP | 3046545 | 3/2000 |
| JP | 2001-519752 | 10/2001 |

OTHER PUBLICATIONS http://www.chemistryexplained.com/Ce-Co/Colligative-Properties.html.*
English language Abstract of JP 2001-519752 T, Oct. 23, 2001.
English language Abstract of JP 3-046545 B2, May 29, 2000.

* cited by examiner

*Primary Examiner* — James McDonough
(74) *Attorney, Agent, or Firm* — Greenblum & Bernstein, P.L.C.

(57) ABSTRACT

A silica glass crucible having a sidewall portion and a bottom portion is provided with a first synthetic silica glass layer constituting an inner layer at least in the sidewall portion, a second synthetic silica glass layer constituting an inner layer at least in a region including a center of the bottom portion, and a natural silica glass layer constituting an outer layer in the sidewall portion and the bottom portion. A melting rate of the second synthetic silica glass layer with respect to a silicon melt is higher than that of the first synthetic silica glass layer. An aluminum concentration of the second synthetic silica glass layer is higher than that of the first synthetic silica glass layer.

6 Claims, 2 Drawing Sheets

SILICA GLASS CRUCIBLE

TECHNICAL FIELD

The present invention relates to a silica glass crucible used for growing a silicon single crystal, and more particularly relates to a silica glass crucible in which bubbles adhering to an inner surface of the crucible are suppressed in the growing step for the silicon single crystal.

BACKGROUND OF THE INVENTION

A silica glass crucible is used for growing a silicon single crystal. For example, the silicon single crystal is produced by heating and melting polycrystalline silicon charged into the silica grass crucible to obtain silicon melt, dipping a seed crystal into the silicon melt, and pulling the seed crystal upwards. During the growth of the silicon single crystal, if bubbles adhering to an inner surface of the silica glass crucible or generated float up and adhere to the silicon single crystal, the bubbles are taken into the silicon single crystal to form air pockets.

In recent years, influence exerted by the air pocket in a silicon wafer on a semiconductor device has been quite serious. The influence of the air pockets is varied depending upon their magnitudes, the number of the air pockets, locations where the air pockets are generated, and the type of a semiconductor device. However, since a size of the air pocket is very larger than that of COP (Crystal Originated Particle), no device can be formed in a space of the air pocket. Especially when the number of air pockets in a wafer is high, yield of the semiconductor device is considerably deteriorated and thus, the wafer itself must be discarded. It is therefore necessary to reduce a possibility of the air pockets existing in the wafer as close to zero as possible.

Japanese Patent Application Laid-Open No. 2001-519752 shows that Ar components of bubbles included in a crucible are taken into a silicon single crystal to form air pockets. Japanese Patent No. 3046545 shows that Ar gas which was taken in when polycrystalline silicon is melted adheres to an inner surface of a crucible, and when a silicon crystal is grown, the Ar gas is taken into the silicon single crystal. As a cause of air pockets, in addition to the Ar gas, SiO gas generated by a reaction between a silica glass crucible and a silicon melt may be taken in.

SUMMARY OF THE INVENTION

The present invention provides a silica glass crucible in which the air pockets are suppressed. The present invention is based on findings that a flaw in an inner surface of a crucible is one of causes of air pockets taken into a silicon single crystal. If there is a flaw on the inner surface of the crucible, SiO gas is generated from this flaw as a nucleus, the SiO gas then moves upwards in the silicon melt, and the gas is taken into the silicon single crystal. Flaws on the inner surface of the crucible are generated when the crucible is produced or when the polycrystalline silicon is charged or melted.

The present invention provides a silica glass crucible in which flaws on the inner surface of the crucible are eliminated before a silicon crystal is grown, thereby restraining SiO gas from being generated, and preventing air pockets in a silicon single crystal.

To solve the conventional problem, the present invention provides with a silica glass crucible having a sidewall portion and a bottom portion, comprising a first synthetic silica glass layer constituting an inner layer at least in the sidewall portion, and a second synthetic silica glass layer constituting an inner layer at least in a region including a center of the bottom portion, wherein a melting rate of the second synthetic silica glass layer with respect to a silicon melt is higher than that of the first synthetic silica glass layer.

In a preferred embodiment of the present invention, the high temperature melting rate of the bottom central portion of the crucible including the projection plane of the silicon single crystal is two to three times of the high temperature melting rate of the periphery of the central portion.

In a preferred embodiment of the present invention, an inner surface layer of the bottom central portion is provided with a synthetic silica layer including aluminum, whereby the high temperature melting rate of a bottom central portion is higher than that of the peripheral of the central portion.

In a preferred embodiment of the present invention, the silica glass crucible as claimed in claim 17, wherein an aluminum concentration of the synthetic silica layer is 2 ppm to 20 ppm.

In a preferred embodiment of the present invention, a thickness at a center of the synthetic silica layer is 30 μm to 200 μm.

In a preferred embodiment of the present invention, an outer layer of the crucible is a natural silica layer, an inner layer of the crucible is a synthetic silica layer, a synthetic silica layer including aluminum is laminated on a bottom central portion of the synthetic silica layer, and a flat inner surface layer is formed without a step with respect to an outer range of the central portion.

According to the silica glass crucible of the present invention, the high temperature melting rate of the central portion of the crucible bottom surface including the projection plane of the silicon single crystal is higher than a high temperature melting rate on an outer side of the central portion, and melting of the inner surface of the central portion is promoted at high temperatures. Therefore, flaws are eliminated and generation of SiO gas is suppressed. That is, even if there is a fine flaw on the bottom surface of the crucible, this flaw can be eliminated for a short time period from a polysilicon melting step to a start of growth of a silicon crystal. Therefore, when the growing step is practically started, the bottom surface of the crucible can be brought into a fine flaw-free state. Meanwhile, it was found that the SiO gas generated on the inner surface of the crucible substantially vertically moved upwards in the silicon melt, and was not affected by convection of the silicon melt. Therefore, when flaws on the inner surface of the central portion of the crucible bottom surface including the projection plane of the silicon single crystal are eliminated, it is possible to effectively prevent the SiO gas from being taken into the silicon single crystal, and to prevent air pockets from being generated in the silicon single crystal.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be described in detail hereinafter with reference to the accompanying drawings.

A silica glass crucible of the present invention is used for growing a silicon single crystal, and is characterized in that a high temperature melting rate of a central portion of a bottom surface of the crucible including a projection plane of the silicon single crystal is higher than that of a periphery of the central portion. The high temperature melting rate means a melting rate with respect to a silicon melt. This is because according to the invention, flaws on an inner surface of a silica glass crucible are eliminated in a state where the crucible is filled with a silicon melt. The silicon melt in the silica glass crucible is set to about 1500° C.

Figure 1:
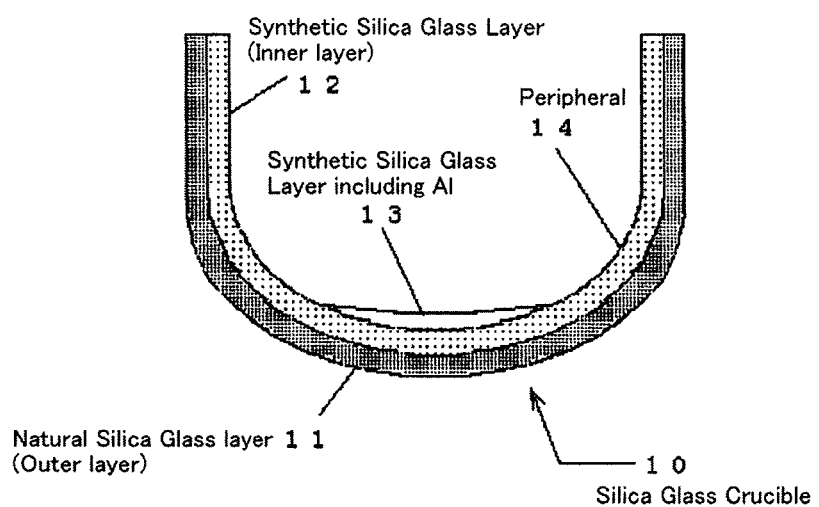
FIG. 1 is a sectional explanatory diagram showing a relation between projection planes of a crucible and a silicon single crystal.

The silica glass crucible of the invention is adjusted such that the high temperature melting rate (melting rate with respect to the silicon melt) of the central portion of the bottom surface of the crucible including the projection plane of the silicon single crystal becomes higher than that of the periphery of the central portion. In the following description, the central portion of the bottom surface of the crucible including the projection plane of the silicon single crystal is simply called a bottom central portion. FIG. 1 shows this state. As shown in FIG. 1, a projection plane of a silicon single crystal 2 is an axial projection plane, and the bottom central portion is a range including a radial cross section S of the silicon single crystal 2 around a rotation axis of a crucible 1. The bottom central portion matches with the silicon crystal cross section S or is slightly wider than the cross section.

The projection plane of the silicon single crystal 2 is not uniquely determined from a shape and a size of the silica glass crucible 1, but the projection plane largely depends on an opening diameter of the silica glass crucible 1. When the opening diameter of the crucible is so smaller than the diameter of the silicon single crystal 2, it becomes difficult to control crystal quality such as oxygen concentration and oxygen in-plane distribution of the silicon crystal. On the other hand, when the opening diameter is so great, cost is increased because it is necessary to increase the device and members in size. Therefore, when the opening diameter of the crucible is defined as $R_o$ and the diameter of the silicon single crystal 2 is defined as $R_s$, it is normal that $R_s$ is set to $0.3R_o$ to $0.6R_o$.

The SiO gas on the inner surface of the crucible substantially vertically moves up in the silicon melt. Therefore, when the SiO gas is restrained from being generated at the bottom central portion, it is possible to effectively prevent the SiO gas from being taken into the silicon single crystal. It is not preferable to increase the melting rate of the entire inner surface of the crucible, because eluted impurities and crystallized silica pieces peeled off are increased, which lowers yield of the silicon single crystal.

In the silica glass crucible of the present invention, the high temperature melting rate of the bottom central portion of the crucible including the projection plane of the silicon single crystal is preferably about two to three times of the high temperature melting rate of the periphery of the central portion. Specifically, the melting rate of the bottom central portion is 10 to 15 µm/hr at 1500° C., and the melting rate at a location outward of the bottom central portion is 3 to 6 µm/hr at 1500° C., for example. When the melting rate of the outward portion is reduced, it is possible to suppress excessive melting of the inner surface of the crucible. When the melting rate of the bottom central portion is increased, it is possible to promote the melting of the bottom central portion, to eliminate flaws on the inner surface and suppress generation of the SiO gas.

When the silicon single crystal is grown, it takes about 10 hours or more to melt the polycrystalline silicon charged into the crucible. At the time of melting, when the polycrystalline silicon charged into the crucible is partially melted and a non-melted portion crumbles, flaws may be generated on the inner surface of the crucible. According to the silica glass crucible of the invention, however, the melting of the inner surface of the crucible is promoted and flaws are eliminated at the time of melting. Therefore, flaws on the inner surface generated at the time of melting are also eliminated, and it is possible to effectively prevent the SiO gas from being taken into the silicon single crystal.

When the melting rate of the bottom central portion is smaller than 10 µm/hr, it becomes difficult to sufficiently eliminate flaws on the inner surface before the pulling operation. It is not preferable that the melting rate of the bottom central portion is higher than 15 µm/hr, because the inner surface of the crucible is excessively melted, which causes a worry that strength is deficient. The melting rate of the location outward of the bottom central portion (periphery of the bottom central portion) can be equal to the melting rate of normal silica glass (about 5 µm/hr).

In the silica glass crucible of the present invention, the high temperature melting rate of the inner surface of the bottom central portion of the crucible is increased by including aluminum in the central portion, for example. It is generally considered that when the aluminum concentration in silica glass is increased, the glass has increased viscosity and it becomes less prone to be melted. For example, an approach is known that changes in melting amount are suppressed by increasing an aluminum content in silica glass (International Publication No. WO 2004-106247). According to the findings of the present inventors, the melting of silica glass can be promoted by including aluminum in silica glass.

An appropriate aluminum content included in the bottom central portion of the inner surface layer of the crucible is in a range of 2 to 20 ppm, and preferably in a range of 2 to 5 ppm. When the aluminum content is less than 2 ppm, the melting rate is not enhanced sufficiently, and when the content exceeds 20 ppm, the silicon crystal yield is lowered. When 2 to 20 ppm aluminum is included, the melting rate of the bottom central portion can be adjusted to about 10 to 15 µm/hr at 1500° C.

Figure 2:
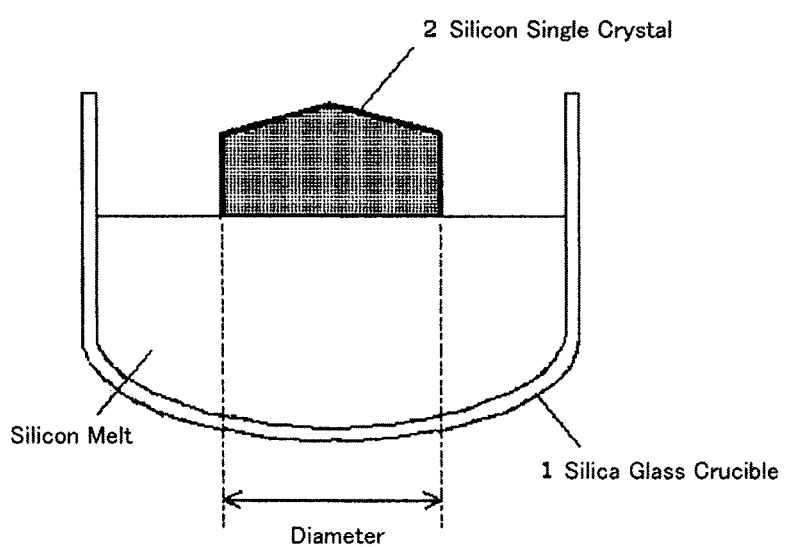
FIG. 2 is a sectional explanatory diagram showing a structure of the crucible.

The silica glass crucible of the invention can be formed into a structure shown in FIG. 2. In FIG. 2, an outer layer of a silica glass crucible 10 is a natural silica layer 11. An inner layer of the crucible is a synthetic silica layer 12, and the total content of impurities such as alkali metal, alkali earth metal, iron, aluminum, boron, and phosphorus is 0.2 ppm or less. A synthetic silica layer 13 including aluminum is laminated on a bottom central portion of the synthetic silica layer 12, and the synthetic silica layer 13 including aluminum has a flat inner surface having no step with respect to a periphery (a corner and a sidewall) 14 of the central portion.

The structure of the silica glass crucible 10 will be explained more specifically. The sidewall portion has a two-layer structure including the natural silica layer 11 and the synthetic silica layer 12, and a region thereof including a center of its bottom has a three-layer structure including the natural silica layer 11, the synthetic silica layer 12, and the synthetic silica layer 13 including aluminum. That is, the outer layer is all constituted of the natural silica layer 11, the synthetic silica layer 12 is formed on the entire inner surface of the natural silica layer 11 including the sidewall portion and the bottom, and the synthetic silica layer 13 including aluminum is selectively formed on the inner surface including the bottom center of the synthetic silica layer 12.

Generally, a concentration of metal impurities included in the natural silica layer 11 is higher than that in the synthetic silica layer 12, and OH group concentration of the natural silica layer 11 is lower than that in the synthetic silica layer 12. The natural silica layer 11 has different characteristics from those of the synthetic silica layer 12 also in X-ray diffraction measurement. Determination of the natural silica layer 11 and the synthetic silica layer 12 needs not to be performed based on one determination element, but to be performed comprehensively based on a plurality of determination elements.

According to the silica glass crucible 10 shown in FIG. 2, the synthetic silica layer 12 constitutes the inner layer of the sidewall portion, and the synthetic silica layer 13 including aluminum constitutes the inner layer of the region including the bottom center. The melting rate of the synthetic silica layer 13 including aluminum with respect to the silicon melt is higher than that of the synthetic silica layer 12. More specifically, it is preferable that the melting rate of the synthetic silica layer 13 including aluminum with respect to the silicon melt be two to three times of the melting rate of the synthetic silica layer 12 with respect to the silicon melt.

As described above, the melting rate of the silica grass with respect to the silicon melt can be controlled by the aluminum concentration. More specifically, the melting rate with respect to the silicon melt becomes higher with increasing the aluminum concentration. Therefore, it is only necessary to set the aluminum concentration of the synthetic silica layer 13 including aluminum higher than that of the synthetic silica layer 12. Specifically, it is only necessary that the aluminum concentration of the synthetic silica layer 13 including aluminum is set to 2 to 20 ppm, and that the aluminum concentration of the synthetic silica layer 12 is set to 0.2 ppm or less. The reason thereof is as described above.

It is preferable that the thickness of the synthetic silica layer 13 including aluminum be in a range of 30 to 200 μm/hr at the bottom center. This is because the depth of flaws generated when the polycrystalline silicon is charged and when the polycrystalline silicon is melted is about 50 μm to 100 μm. Therefore, an appropriate center layer thickness of the synthetic silica layer 13 including aluminum at the bottom central portion is in a range of 30 μm to 200 μm, and preferably, in a range of 50 μm to 120 μm. When the layer thickness is less than 30 μm, flaws on the inner surface are not sufficiently eliminated in some cases. When the layer thickness is greater than 200 μm, the effect is substantially the same. It is preferable that the thickness of the synthetic silica layer 13 including aluminum be smaller at locations farther away from the bottom center. With this structure, even if the synthetic silica layer 13 including aluminum is provided, no step is generated in the inner surface of the silica glass crucible 10 and thus, various inconveniences caused by the step can be prevented.

As described above, the projection plane of the silicon single crystal is not uniquely determined from the shape and size of the silica glass crucible, and when the opening diameter of the crucible is defined as $R_o$ and the diameter of the silicon single crystal is defined as $R_s$, it is normal that $R_s$ is set to $0.3R_o$ to $0.6R_o$. Taking this point into consideration, when a diameter of a planar region of the synthetic silica layer 13 including aluminum is defined as $R_1$, it is preferable that $R_1$ be $0.3R_o$ or more and $0.6R_o$ or less. When the diameter $R_1$ of the planar region of the synthetic silica layer 13 including aluminum is smaller than $0.3R_o$, the projection plane of the silicon single crystal cannot be covered, and the probability that bubbles of the SiO gas generated from the synthetic silica layer 12 are taken into the silicon single crystal is increased. When the diameter $R_1$ of the planar region of the synthetic silica layer 13 including aluminum exceeds $0.6R_o$, the projection plane of the silicon single crystal can reliably be covered. However, impurities eluting into the silicon melt may increase, and the yield of the silicon single crystal may decrease.

The diameter $R_1$ of the planar region of the synthetic silica layer 13 including aluminum will be explained specifically. For example, when a silicon single crystal having a diameter of about 300 mm is to be grown using a silica glass crucible of 32 inches (its opening diameter $R_o$ is about 800 mm), the lower limit of a diameter $R_1$ of a circular region of the synthetic silica layer 13 including aluminum formed at the bottom of the crucible is $0.3R_o$=240 mm, and the upper limit thereof is $0.6R_o$=480 mm. Usually, the 32-inch crucible is used for growing the silicon single crystal having the diameter of about 300 mm, and it is preferable that the diameter $R_1$ of the planar region of the synthetic silica layer 13 including aluminum in this case be about 300 mm. This value satisfies the condition of not less than 240 mm and not more than 480 mm. When the diameter $R_1$ of the planar region of the synthetic silica layer 13 including aluminum is not less than $0.3R_o$ and not more than $0.6R_o$, it is possible to effectively suppress the generation of the SiO gas bubbles which can be taken into the silicon single crystal being grown without hardly lowering the silicon single crystal yield.

As described above, the SiO gas bubbles substantially vertically float. However, it is also conceived that bubbles generated outward of the projection plane of the silicon single crystal being grown (region where the synthetic silica layer 13 including aluminum is not formed) float while slightly shifting horizontally for any reason and, as a result, the bubbles are taken into the silicon single crystal. Because positions of such bubbles are near the outer periphery of the silicon single crystal and the outer peripheral area of the silicon single crystal is ground later as an unnecessary portion, there is no problem even if the bubbles are taken in the silicon single crystal.

The present invention is in no way limited to the aforementioned embodiments, but rather various modifications are possible within the scope of the invention as recited in the claims, and naturally these modifications are included within the scope of the invention.

EXAMPLES

Silica glass crucibles (opening diameter thereof is 32 inches) of structures shown in FIG. 2 having a natural silica outer layer and a synthetic silica inner layer were produced under conditions shown in Table 1 or 2, and silicon single crystals having a diameter of about 300 mm were pulled-up with the crucibles.

after pulling the silicon single crystal, wafers having thickness of about 1 mm were produced by slicing the silicon single crystal ingot with a wire-saw, and the surface of the wafers were polished. Next, the air pocket generation ratio of each polished wafers was measured. the are pocket generation ratio is the value obtained by dividing total number of the air pocket including all wafers obtained from one silicon single crystal by total number of the wafers. A particle counter was used for counting the number of the air pocket exposed on the surface of the polished wafer.

The yield of the silicon single crystal was also measured. The yield of the silicon single crystal is defined as the weight ratio of the silicon single crystal to the polycrystalline silicon material. Since all silicon melt in the crucible was not consumed and only straight body part of the ingot excepting the top and bottom part is the object to be measured. Thus, the yield of the silicon single crystal is under 100% even if the silicon single crystal is fully pulled-up, and more than 80% of the yield will be a good result. Results thereof are shown in Tables 1 and 2.

Air pockets were not generated in any of crucibles of examples A1 to A4, and each yield of the silicon single crystal were high. In a crucible of a comparative example C1, a generation ratio of air pockets was high. Also in a crucible of a comparative example C2, the generation ratio of air pockets was not sufficiently reduced. In a crucible of a comparative example C3, although no air pocket was generated, yield of the silicon single crystal was considerably lowered. According to the results shown in Table 1, it was confirmed that the aluminum content of the synthetic silica layer provided at the bottom central portion is preferably in a range of about 2 ppm to 20 ppm.

In any of crucibles of examples B1 to B4, no air pocket was generated, and each yield of the silicon single crystal were high. In a crucible of a comparative example C4, although no air pocket was generated, yield of the silicon crystal was considerably lowered, and in a crucible of a comparative example C5, a generation ratio of air pockets was high. According to the results in Table 2, it was confirmed that the thickness at the center of the synthetic silica layer including aluminum provided at the bottom central portion is preferably in a range of 30 μm to 200 μm.

TABLE 1

|  | Example | | | | Comparative Example | | |
| --- | --- | --- | --- | --- | --- | --- | --- |
|  | A1 | A2 | A3 | A4 | C1 | C2 | C3 |
| thickness [μm] at bottom central portion | 100 | 100 | 100 | 100 | 100 | 100 | 100 |
| Al content [ppm] | 2.4 | 5.7 | 11.8 | 19.1 | 0 | 1.6 | 23.2 |
| Air pocket generation ratio [%] | 0 | 0 | 0 | 0 | 9.7 | 4.4 | 0 |
| Silicon crystal yield [%] | 90 | 90 | 90 | 85 | 90 | 90 | 50 |
| Evaluation | ◯ | ◯ | ◯ | ◯ | X | X | X |

(Note)
thickness at bottom central portion is thickness at the center of synthetic silica layer including Al

TABLE 2

|  | Example | | | | Comparative Example | |
| --- | --- | --- | --- | --- | --- | --- |
|  | B1 | B2 | B3 | B4 | C4 | C5 |
| thickness [μm] at bottom central portion | 30 | 50 | 100 | 200 | 250 | 10 |
| Al content [ppm] | 5.7 | 5.7 | 5.7 | 5.7 | 5.7 | 5.7 |
| Air pocket generation ratio [%] | 0 | 0 | 0 | 0 | 0 | 8.1 |
| Silicon crystal yield [%] | 90 | 90 | 90 | 80 | 45 | 90 |
| Evaluation | ◯ | ◯ | ◯ | ◯ | X | X |

(Note)
thickness at bottom central portion is thickness at the center of synthetic silica layer including Al

What is claimed is:

1. A silica glass crucible having a sidewall portion and a bottom portion, comprising:
   a natural silica glass layer constituting an outer layer in the sidewall portion and the bottom portion;
   a first synthetic silica glass layer constituting an inner layer at least in the sidewall portion; and
   a second synthetic silica glass layer constituting an inner layer at least in a region including a center of the bottom portion, wherein:
   the first synthetic silica glass layer is formed on an inner surface including a sidewall portion and a bottom portion of the natural silica glass layer,
   the second synthetic silica glass layer is formed on an inner surface including a center of a bottom portion of the first synthetic silica glass layer,
   the thickness of the second synthetic silica glass layer is 30 μm to 200 μm at the center of the bottom portion, and
   a melting rate of the second synthetic silica glass layer with respect to a silicon melt is higher than that of the first synthetic silica glass layer.

2. The silica glass crucible as claimed in claim 1, wherein a thickness of the second synthetic silica glass layer is smaller at locations farther away from the center of the bottom portion.

3. The silica glass crucible as claimed in claim 1, wherein the melting rate of the second synthetic silica glass layer with respect to the silicon melt is two to three times of the melting rate of the first synthetic silica glass layer with respect to the silicon melt.

4. The silica glass crucible as claimed in claim 1, wherein an aluminum concentration of the second synthetic silica glass layer is higher than that of the first synthetic silica glass layer.

5. The silica glass crucible as claimed in claim 4, wherein the aluminum concentration of the second synthetic silica glass layer is 2 ppm to 20 ppm.

6. The silica glass crucible as claimed in claim 5, wherein an aluminum concentration of the first synthetic silica glass layer is 0.2 ppm or less.

* * * * *